United States Patent
Chen et al.

(10) Patent No.: US 10,491,213 B2
(45) Date of Patent: Nov. 26, 2019

(54) SELF-CAPACITIVE TOUCH SENSING CIRCUIT AND NOISE SUPPRESSING METHOD APPLIED TO SELF-CAPACITIVE TOUCH PANEL

(71) Applicant: Raydium Semiconductor Corporation, Hsinchu (TW)

(72) Inventors: Chih-Hsiung Chen, Hsinchu County (TW); Yu-Chin Hsu, Hsinchu (TW); Meng-Yi Chen, Kaohsiung (TW); Chih Yuan, New Taipei (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 109 days.

(21) Appl. No.: 15/790,121

(22) Filed: Oct. 23, 2017

(65) Prior Publication Data

US 2018/0115313 A1 Apr. 26, 2018

Related U.S. Application Data

(60) Provisional application No. 62/411,714, filed on Oct. 24, 2016.

(51) Int. Cl.
*H03K 17/96* (2006.01)
*G06F 3/044* (2006.01)
*G06F 3/041* (2006.01)

(52) U.S. Cl.
CPC ........... *H03K 17/962* (2013.01); *G06F 3/044* (2013.01); *G06F 3/0418* (2013.01); *H03K 2217/960705* (2013.01); *H03K 2217/960735* (2013.01)

(58) Field of Classification Search
CPC ...... G06F 3/044; G06F 3/0416; G06F 3/0418; G06F 3/0412; G06F 3/041; G06F 3/03545; G06F 3/03547; G06F 2203/04104; G06F 2203/04106; G06F 2203/04101; G06F 11/002
See application file for complete search history.

(56) References Cited

U.S. PATENT DOCUMENTS

2010/0328262 A1* 12/2010 Huang ................. G06F 3/0416
345/174

* cited by examiner

*Primary Examiner* — Dong Hui Liang

(57) ABSTRACT

A self-capacitive touch sensing circuit including an operational amplifier, an internal capacitor, a first switch and a second switch is disclosed. A first input terminal and a second input terminal of operational amplifier are coupled to a capacitor and ground respectively and an output terminal of operational amplifier outputs an output voltage. The internal capacitor is coupled between the output terminal and first input terminal of operational amplifier. One terminal of first switch is coupled to a first external charging voltage and another terminal of first switch is coupled between the capacitor and the first input terminal. The first external charging voltage is higher than the second external charging voltage. The first switch and second switch are switched according to a specific order, so that the first external charging voltage or second external charging voltage will charge the capacitor.

12 Claims, 4 Drawing Sheets

SELF-CAPACITIVE TOUCH SENSING CIRCUIT AND NOISE SUPPRESSING METHOD APPLIED TO SELF-CAPACITIVE TOUCH PANEL

BACKGROUND OF THE INVENTION

1. Field of the Invention

This invention relates to a touch panel, especially to a self-capacitive touch sensing circuit and a noise suppressing method applied to a self-capacitive touch panel.

2. Description of the Prior Art

In general, the self-capacitive touch panel can use a design of in-cell structure or on-cell structure to realize a thin self-capacitive touch panel.

As to the self-capacitive touch sensing circuit used in prior art, for example, a shown in FIG. 1, the conventional self-capacitive touch sensing circuit charges the capacitor Cext to a first external charging voltage V1 under a first phase, so that the charge amount stored in the capacitor Cext is a product of the capacitor Cex and the first external charging voltage V1.

However, in the in-cell or on-cell self-capacitive touch panel, the self-capacitive touch sensing circuit will be closer to the panel and easier to be interfered by the noise generated by reversing liquid crystals. As shown in FIG. 2, the upper curve is a frequency response curve obtained under a condition of having an external noise of 10 KHZ frequency, and the lower curve is a frequency response curve obtained under a condition of no external noise. It can be found from the lower curve that the signal part is located at DC level; it can be found from the upper curve that the upper curve includes not only the signal part located at DC level but also the noise part having a frequency of 10 KHZ. Since the frequency of the noise part and the frequency of the signal part of the upper curve are too close, it is hard for the self-capacitive touch sensing circuit to use a simple low-pass filter to filter the noise part out.

In addition, because the self-capacitive touch sensing circuit will be farther from the finger signal source, the signal-to-noise ratio of the touch sensing signal and the touch sensing performance of the self-capacitive touch panel will become poor. It will be necessary to use additional hardware to increase the signal-to-noise ratio of the touch sensing signal; therefore, the manufacturing cost of the self-capacitive touch panel fails to be reduced.

SUMMARY OF THE INVENTION

Therefore, the invention provides a self-capacitive touch sensing circuit and a noise suppressing method applied to a self-capacitive touch panel to solve the above-mentioned problems.

An embodiment of the invention is a self-capacitive touch sensing circuit applied to a self-capacitive touch panel. In this embodiment, the self-capacitive touch sensing circuit is used for sensing a capacitance variation of a capacitor when the self-capacitive touch panel is touched and suppressing an external environmental noise. The self-capacitive touch sensing circuit includes an operational amplifier, an internal capacitor, a first switch and a second switch. The operational amplifier has a first input terminal, a second input terminal and an output terminal, wherein the first input terminal is coupled to the capacitor and the second input terminal is coupled to ground, and the output terminal outputs an output voltage. The internal capacitor is coupled between the output terminal and the first input terminal of the operational amplifier. The first switch has a terminal coupled to a first external charging voltage and another terminal coupled between the capacitor and the first input terminal. The second switch has a terminal coupled to a second external charging voltage and another terminal coupled between the capacitor and the first input terminal. The first external charging voltage is higher than the second external charging voltage; the first switch and the second switch are switched according to a specific order, so that the first external charging voltage or the second external charging voltage charges the capacitor.

In an embodiment, the another terminal of the first switch and the another terminal of the second switch are both coupled to a node between the capacitor and the first input terminal.

In an embodiment, the self-capacitive touch sensing circuit further includes a third switch coupled between the node and the first input terminal.

In an embodiment, the self-capacitive touch sensing circuit further includes an analog-to-digital converter coupled to the output terminal of the operational amplifier and a digital signal processor coupled to the analog-to-digital converter.

In an embodiment, the self-capacitive touch sensing circuit further includes a first polarity unit and a second polarity unit. The first polarity unit is coupled between the output terminal of the operational amplifier and the analog-to-digital converter and used for receiving the output voltage having analog form from the output terminal of the operational amplifier and then outputting the output voltage to the analog-to-digital converter by maintaining a polarity of the output voltage. The second polarity unit is coupled between the output terminal of the operational amplifier and the analog-to-digital converter and used for receiving the output voltage having analog form from the output terminal of the operational amplifier and then outputting the output voltage to the analog-to-digital converter by reversing the polarity of the output voltage.

In an embodiment, the self-capacitive touch sensing circuit further includes a first polarity unit and a second polarity unit. The first polarity unit is coupled between the analog-to-digital converter and the digital signal processor and used for receiving the output voltage having digital form converted from analog form by the analog-to-digital converter and then outputting the output voltage to the digital signal processor by maintaining a polarity of the output voltage. The second polarity unit is coupled between the analog-to-digital converter and the digital signal processor and used for receiving the output voltage having digital form converted from analog form by the analog-to-digital converter and then outputting the output voltage to the digital signal processor by reversing the polarity of the output voltage.

In an embodiment, the self-capacitive touch sensing circuit further includes another digital signal processor. The another digital signal processor is coupled to the first polarity unit and the second polarity unit respectively and used for receiving the output voltage maintaining polarity from the first polarity unit and receiving the output voltage reversing polarity from the second polarity unit respectively.

In an embodiment, under an odd-numbered phase, the first switch is conducted but the second switch and the third switch are not conducted, then the first external charging voltage charges the capacitor, and a first charge amount stored in the capacitor is a product of a capacitance of the capacitor and the first external charging voltage.

In an embodiment, under an even-numbered phase, the third switch is conducted but the first switch and the second switch are not conducted, then the output voltage is a quotient of the first charge amount divided by the internal capacitor.

In an embodiment, when the capacitor is touched, a product of a first output voltage variation of the output voltage and the internal capacitor is equal to a product of the first external charging voltage and the capacitance variation when the capacitor is touched.

In an embodiment, under an odd-numbered phase, the second switch is conducted but the first switch and the third switch are not conducted, then the second external charging voltage charges the capacitor, and a second charge amount stored in the capacitor is a product of a capacitance of the capacitor and the second external charging voltage.

In an embodiment, under an even-numbered phase, the third switch is conducted but the first switch and the second switch are not conducted, then the output voltage is a quotient of the second charge amount divided by the internal capacitor.

In an embodiment, when the capacitor is touched, a product of a second output voltage variation of the output voltage and the internal capacitor is equal to a product of the second external charging voltage and the capacitance variation when the capacitor is touched.

Another embodiment of the invention is a noise suppressing method. In this embodiment, the noise suppressing method is applied to a self-capacitive touch panel to suppress an external environmental noise when the self-capacitive touch panel senses a capacitance changing signal generated by touch. The noise suppressing method includes steps of: (a) instantly sensing a raw band of the external environmental noise, wherein the raw band is near a direct current (DC) band of the capacitance changing signal; (b) selecting a corresponding capacitance driving modulation coefficient according to a sensing result of step (a) to move the external environmental noise from the raw band to a high-frequency band, wherein a frequency of the high-frequency band is higher than that of the raw band and the DC band; (c) pulling the capacitance changing signal back to the DC band through a demodulation mechanism to make the capacitance changing signal in the DC band separated from the external environmental noise in the high-frequency band; and (d) using a low-pass filter to filter out the external environmental noise in the high-frequency band to keep the capacitance changing signal in the DC band.

Compared to the prior art, the invention provides a self-capacitive touch sensing circuit and a noise suppressing method applied to a self-capacitive touch panel to move a self-capacitive sensing signal to a band having less environmental noise through a driving way of instantly adjusting modulation coefficient and then modulate the self-capacitive sensing signal to the DC band and use a simple one-stage low-frequency filter to filter the self-capacitive sensing signal, so that the signal-to-noise ratio of the self-capacitive sensing signal can be effectively increased. The self-capacitive touch sensing circuit and the noise suppressing method of the invention have the following advantages:

(1) Suitable for high noise capacitance sensing environment;
(2) Effectively reducing capacitance driving time;
(3) Effectively reducing entire power consumption for capacitance driving;
(4) Achieving better touch sensing effect.

The advantage and spirit of the invention may be understood by the following detailed descriptions together with the appended drawings.

BRIEF DESCRIPTION OF THE APPENDED DRAWINGS

DETAILED DESCRIPTION OF THE INVENTION

An embodiment of the invention is a self-capacitive touch sensing circuit applied to a self-capacitive touch panel. In this embodiment, the self-capacitive touch sensing circuit is used for sensing a capacitance variation of a capacitor when the self-capacitive touch panel is touched and suppressing an external environmental noise.

Figure 3:
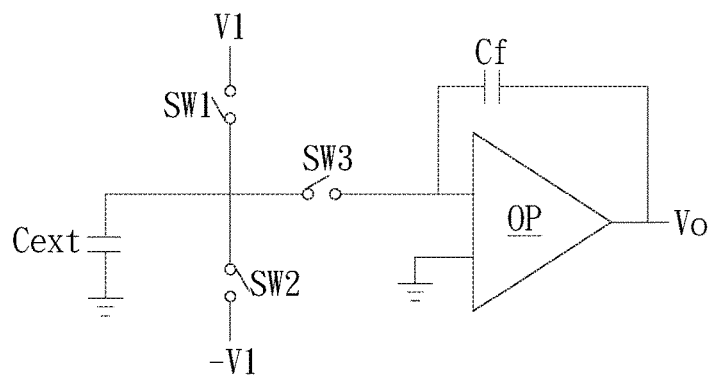
FIG. 3 illustrates a schematic diagram of the self-capacitive touch sensing circuit in a preferred embodiment of the invention.

Please refer to FIG. 3. FIG. 3 illustrates a schematic diagram of the self-capacitive touch sensing circuit in this embodiment. As shown in FIG. 3, the self-capacitive touch sensing circuit includes an operational amplifier OP, a capacitor Cext, an internal capacitor Cf, a first switch SW1, a second switch SW2 and a third switch SW3.

The operational amplifier OP has a first input terminal, a second input terminal and an output terminal, wherein the first input terminal is coupled to the capacitor Cext and the second input terminal is coupled to ground, and the output terminal outputs an output voltage Vo. The first switch SW1 has a terminal coupled to a first external charging voltage V1 and another terminal coupled between the capacitor Cext and the first input terminal of the operational amplifier OP. The second switch SW2 has a terminal coupled to a second external charging voltage −V1 and another terminal coupled between the capacitor Cext and the first input terminal of the operational amplifier OP. The another terminal of the first switch SW1 and the another terminal of the second switch SW2 are both coupled to a node. The third switch SW3 is coupled between the node and the first input terminal of the operational amplifier OP. One terminal of the internal capacitor Cf is coupled to the output terminal of the operational amplifier OP and another terminal of the internal capacitor Cf is coupled between the third switch SW3 and the first input terminal of the operational amplifier OP.

It should be noticed that the first external charging voltage V1 is higher than the second external charging voltage −V1. The first switch SW1 and the second switch SW2 are switched according to a specific order, so that the first external charging voltage V1 or the second external charging voltage −V1 charges the capacitor Cext, but not limited to this.

Next, different driving methods and capacitance to charge detection mechanisms used in the invention will be introduced in detail.

(1) The First Driving Method:

Under the odd-numbered phase (e.g., the first phase, the third phase, . . . ), the first switch SW1 is conducted but the second switch SW2 and the third switch SW3 are not conducted, then the first external charging voltage V1 charges the capacitor Cext, and a first charge amount stored in the capacitor Cext will be a product of a capacitance of the capacitor Cext and the first external charging voltage V1, namely the first charge amount stored in the capacitor Cext will be equal to [(Cext)×(V1)].

Under the even-numbered phase (e.g., the second phase, the fourth phase, . . . ), the third switch SW3 is conducted but the first switch SW1 and the second switch SW2 are not conducted, then the output voltage Vo will be a quotient of the first charge amount [(Cext)×(V1)] divided by a capacitance of the internal capacitor Cf, namely the output voltage Vo will be equal to [(Cext)×(V1)]/(Cf).

When the capacitor Cext is touched, a product of a first output voltage variation Δ Vout1 of the output voltage Vo and the internal capacitor Cf will be equal to a product of the first external charging voltage V1 and the capacitance variation ΔCfinger when the capacitor Cext is touched, namely the first output voltage variation ΔVout1 of the output voltage Vo will be equal to [(ΔCfinger)×(V1)]/(Cf).

If the self-capacitive touch sensing signal is interfered by external noises, a product of a third output voltage variation ΔVout3 of the output voltage Vo and the internal capacitor Cf will be equal to a product of the capacitor Cext and a voltage variation Δ Vnoise caused by noise interference, namely the third output voltage variation ΔVout3 of the output voltage Vo will be equal to [(ΔVnoise)×(Cext)]/(Cf).

(2) The Second Driving Method:

Under the odd-numbered phase (e.g., the first phase, the third phase, . . . ), the second switch SW2 is conducted but the first switch SW1 and the third switch SW3 are not conducted, then the second external charging voltage −V1 charges the capacitor Cext, and a second charge amount stored in the capacitor Cext will be a product of a capacitance of the capacitor Cext and the second external charging voltage −V1, namely the second charge amount stored in the capacitor Cext will be equal to [(Cext)×(−V1)].

Under the even-numbered phase (e.g., the second phase, the fourth phase, . . . ), the third switch SW3 is conducted but the first switch SW1 and the second switch SW2 are not conducted, then the output voltage Vo is a quotient of the second charge amount divided by the internal capacitor Cf, namely the output voltage Vo will be equal to [(Cext)×(−V1)]/(Cf).

When the capacitor Cext is touched, a product of a second output voltage variation ΔVout2 of the output voltage Vo and the internal capacitor Cf will be equal to a product of the second external charging voltage −V1 and the capacitance variation Δ Cfinger when the capacitor Cext is touched, namely the second output voltage variation ΔVout2 of the output voltage Vo will be equal to [(ΔCfinger)×(−V1)]/(Cf).

If the self-capacitive touch sensing signal is interfered by external noises, a product of the third output voltage variation ΔVout3 of the output voltage Vo and the internal capacitor Cf will be equal to a product of the capacitor Cext and a voltage variation Δ Vnoise caused by noise interference, namely the third output voltage variation ΔVout3 of the output voltage Vo will be equal to [(ΔVnoise)×(Cext)]/(Cf).

Figure 4A:
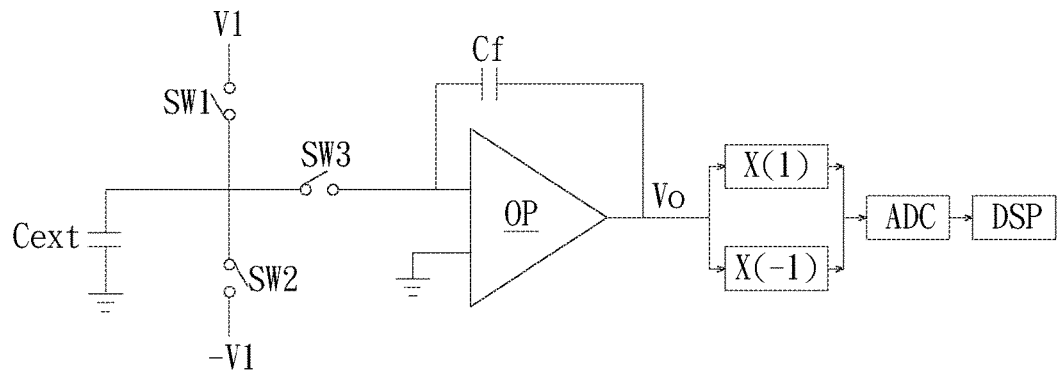
FIG. 4A-FIG. 4C illustrate different embodiments of the self-capacitive touch sensing circuit respectively.
Figure 4B:
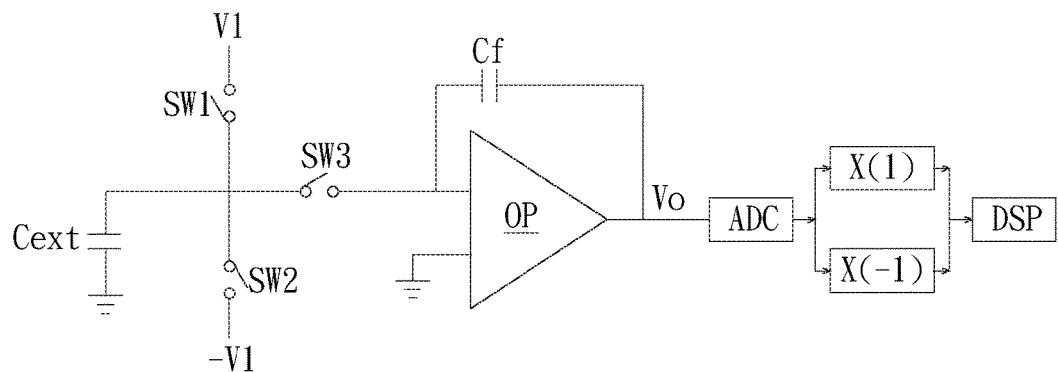
Figure 4C:
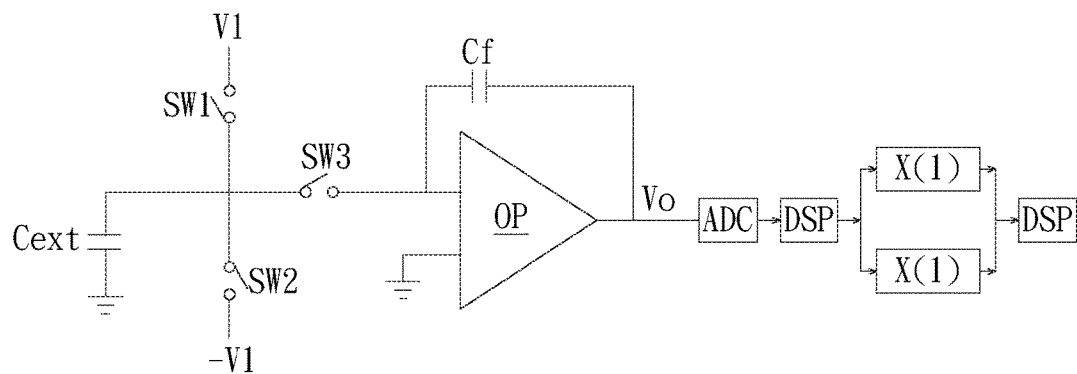

Then, please refer to FIG. 4A~FIG. 4C. FIG. 4A~FIG. 4C illustrate different embodiments of the self-capacitive touch sensing circuit respectively.

In the embodiment shown in FIG. 4A, the self-capacitive touch sensing circuit not only includes the circuit shown in FIG. 3, but also includes an analog-to-digital converter ADC, a digital signal processor DSP, a first polarity unit X(1) and a second polarity unit X(−1). The first polarity unit X(1) and the second polarity unit X(−1) are coupled in parallel between the output terminal of the operational amplifier OP and the input terminal of the analog-to-digital converter ADC. The output terminal of the analog-to-digital converter ADC is coupled to the input terminal of the digital signal processor DSP.

The first polarity unit X(1) is used for receiving the output voltage Vo having analog form from the output terminal of the operational amplifier OP and then outputting the output voltage Vo to the input terminal of the analog-to-digital converter ADC by maintaining the polarity of the output voltage Vo. The second polarity unit X(−1) is used for receiving the output voltage Vo having analog form from the output terminal of the operational amplifier OP and then outputting the output voltage to the input terminal of the analog-to-digital converter ADC by reversing the polarity of the output voltage Vo. When the analog-to-digital converter ADC receives the output voltage Vo having analog form and maintained polarity outputted by the first polarity unit X(1) and the output voltage Vo having analog form and reversed polarity outputted by the second polarity unit X(−1) respectively, the analog-to-digital converter ADC will convert them into the output voltages Vo having digital form and then output the output voltages Vo having digital form to the digital signal processor DSP to perform digital signal processing on them.

In the embodiment shown in FIG. 4B, the input terminal of the analog-to-digital converter ADC is coupled to the output terminal of the operational amplifier OP. The first polarity unit X(1) and the second polarity unit X(−1) are coupled in parallel between the output terminal of the analog-to-digital converter ADC and the input terminal of the digital signal processor DSP.

The analog-to-digital converter ADC is used to receive the output voltage Vo having analog form from the output terminal of the operational amplifier OP and then convert the output voltage Vo having analog form into the output voltage Vo having digital form. The first polarity unit X(1) is used for receiving the output voltage Vo having digital form which is converted from analog form by the analog-to-digital converter ADC and then outputting the output voltage Vo having digital form to the input terminal of the digital signal processor DSP by maintaining the polarity of the output voltage Vo. The second polarity unit X(−1) is used for receiving the output voltage Vo having digital form which is converted from analog form by the analog-to-digital converter ADC and then outputting the output voltage Vo having digital form to the digital signal processor DSP by reversing the polarity of the output voltage vo. When the digital signal processor DSP receives the output voltage Vo having digital form and maintained polarity outputted by the first polarity unit X(1) and the output voltage Vo having digital form and reversed polarity outputted by the second polarity unit X(−1) respectively, the digital signal processor DSP will perform digital signal processing on them respectively.

In the embodiment shown in FIG. 4C, the input terminal of the analog-to-digital converter ADC is coupled to the output terminal of the operational amplifier OP. The input terminal of the digital signal processor DSP is coupled to the output terminal of the analog-to-digital converter ADC. The first polarity unit X(1) and the second polarity unit X(−1) are coupled in parallel between the output terminal of the digital signal processor DSP and the input terminal of another digital signal processor DSP.

The analog-to-digital converter ADC is used to receive the output voltage Vo having analog form from the output terminal of the operational amplifier OP and convert the output voltage Vo having analog form into the output voltage Vo having digital form and then output the output voltage Vo having digital form to the digital signal processor DSP to perform digital signal processing on it.

The first polarity unit X(1) is used for receiving the output voltage having digital form which is converted from analog form by the analog-to-digital converter ADC and then processed by the digital signal processor DSP in order from the output terminal of the digital signal processor DSP and then maintaining the polarity of the output voltage Vo and outputting the output voltage Vo to the input terminal of another digital signal processor DSP. The second polarity unit X(−1) is used for receiving the output voltage Vo having digital form which is converted from analog form by the analog-to-digital converter ADC and then processed by the digital signal processor DSP in order from the output terminal of the digital signal processor DSP and then reversing the polarity of the output voltage Vo and outputting the output voltage Vo to the input terminal of another digital signal processor DSP.

When the another digital signal processor DSP receives the output voltage Vo having digital form and maintained polarity from the first polarity unit X(1) and receives the output voltage Vo having digital form and reversed polarity from the second polarity unit X(−1) respectively, the another digital signal processor DSP will perform digital signal processing on them respectively.

It should be noticed that, in the above-mentioned embodiments, every time when the polarity of the external charging voltage changes, such as switching from the first external charging voltage (V1) to the second external charging voltage (−V1), the polarity of the output voltage Vo will be also changed.

Under the odd-numbered phase (e.g., the first phase, the third phase, . . . ), when the first external charging voltage (V1) having positive polarity charges the capacitor Cext, the output voltage variation caused by touch and noise interference will be equal to $[(\Delta C\text{finger}) \times (V1)/(Cf)] + [(\Delta V\text{noise}) \times (C\text{ext})/(Cf)]$; when the second external charging voltage (−V1) having negative polarity charges the capacitor Cext, the output voltage variation caused by touch and noise interference will be equal to $[(\Delta C\text{finger}) \times (-V1)/(Cf)] + [(\Delta V\text{noise}) \times (C\text{ext})/(Cf)]$. If the scan frequency is much larger than the noise frequency during the scanning process, the times (e.g., N/2) that the first external charging voltage (V1) having positive polarity charges the capacitor Cext is equal to the times (e.g., N/2) that the second external charging voltage (−V1) having negative polarity charges the capacitor Cext, then the total output voltage variation caused by touch and noise interference will be equal to $(N/2) \times \{[(\Delta C\text{finger}) \times (V1)/(Cf)] + [(\Delta V\text{noise}) \times (C\text{ext})/(Cf)]\} - (N/2) \times \{[(\Delta C\text{finger}) \times (-V1)/(Cf)] + [(\Delta V\text{noise}) \times (C\text{ext})/(Cf)]\} = N \times V1 \times (\Delta C\text{finger})/(Cf)$.

It should be noticed that, in the embodiment shown in FIG. 4A, the second polarity unit X(−1) will reverse the polarity of the analog output voltage Vo; in the embodiments shown in FIG. 4B and FIG. 4C, the second polarity unit X(−1) will reverse the polarity of the digital output voltage Vo. That is to say, the output voltage polarity reversing mechanism in the invention can be performed on the analog signal or the digital signal.

In addition, since the above-mentioned output voltage polarity reversing mechanism has limited noise suppressing effect on the noises at the same frequency or similar frequencies, the above-mentioned output voltage polarity reversing mechanism should further dynamically or non-dynamically adjust the phase switching frequency by cooperating with environment detection technology. For example, under the odd-numbered phase (e.g., the first phase, the third phase, . . . ), there should be no limitation to the times, orders or correlations for the first external charging voltage (V1) having positive polarity and the second external charging voltage (−V1) having negative polarity to charge the capacitor Cext. Therefore, different coefficient combinations can be used to adjust them based on practical needs to achieve the best noise suppression effect.

Figure 1:
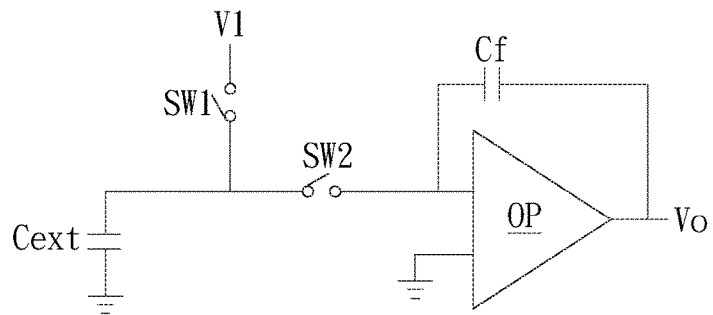
FIG. 1 illustrates a schematic diagram of the self-capacitive touch sensing circuit in prior art.
Figure 2:
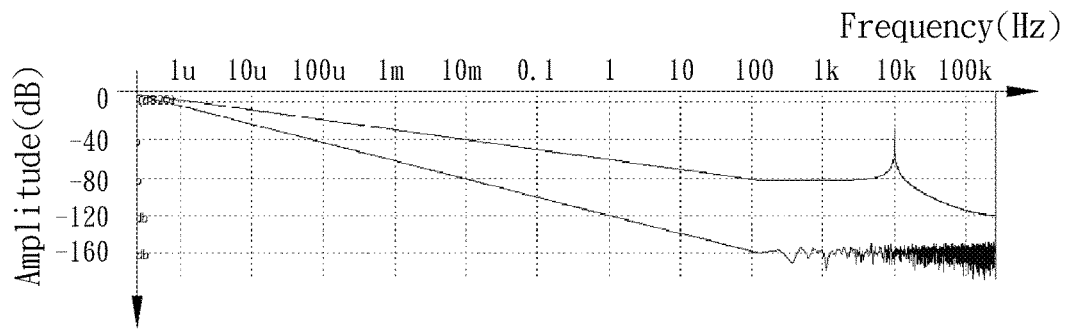
FIG. 2 illustrates frequency response diagrams of the self-capacitive touch sensing signal obtained by the self-capacitive touch sensing circuit under the condition with external noise and the condition without external noise respectively in prior art.
Figure 5:
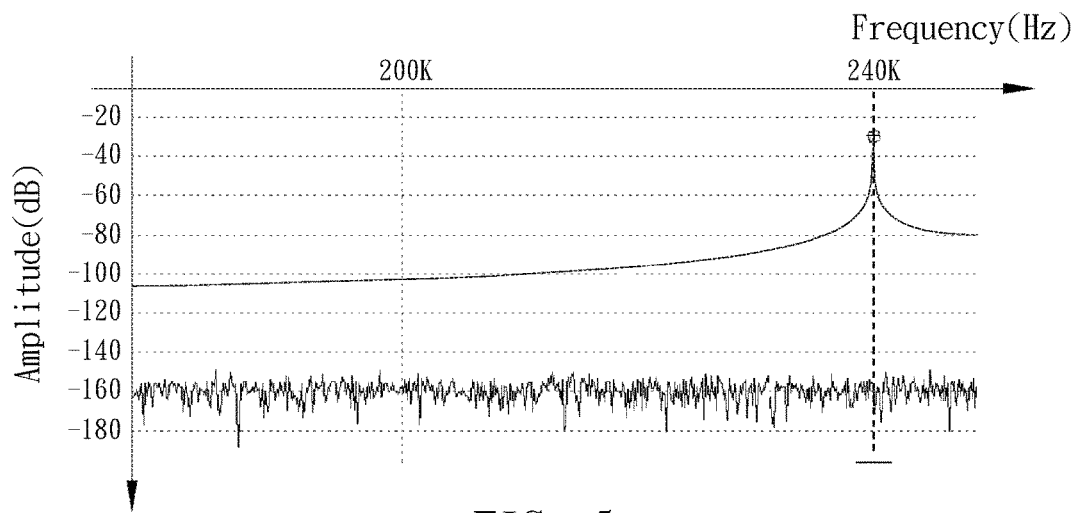
FIG. 5 illustrates a frequency response diagram of the self-capacitive touch sensing signal obtained by the self-capacitive touch sensing circuit and its low-frequency part extending to the high-frequency region under the condition with external noise in the invention.

Then, please refer to FIG. 5. As shown in FIG. 5, the upper curve is a frequency response curve under the condition having external noises at 10 KHz frequency and the lower curve is a frequency response curve under the condition without external noises. Compared with the prior art shown in FIG. 2, it can be found from FIG. 5 that under the condition having external noises at 10 KHz frequency, the self-capacitive touch sensing signal obtained by the self-capacitive touch sensing circuit of the invention not only includes the signal part at the DC level, but also extends its low-frequency part at 10 KHz frequency to the high-frequency region at 240 KHz; therefore, the frequency range of the noise part of the self-capacitive touch sensing signal and the frequency range of the signal part of the self-capacitive touch sensing signal can be easily separated, and the noise part of the self-capacitive touch sensing signal can be filtered out through the simple low-pass filter.

Figure 6:
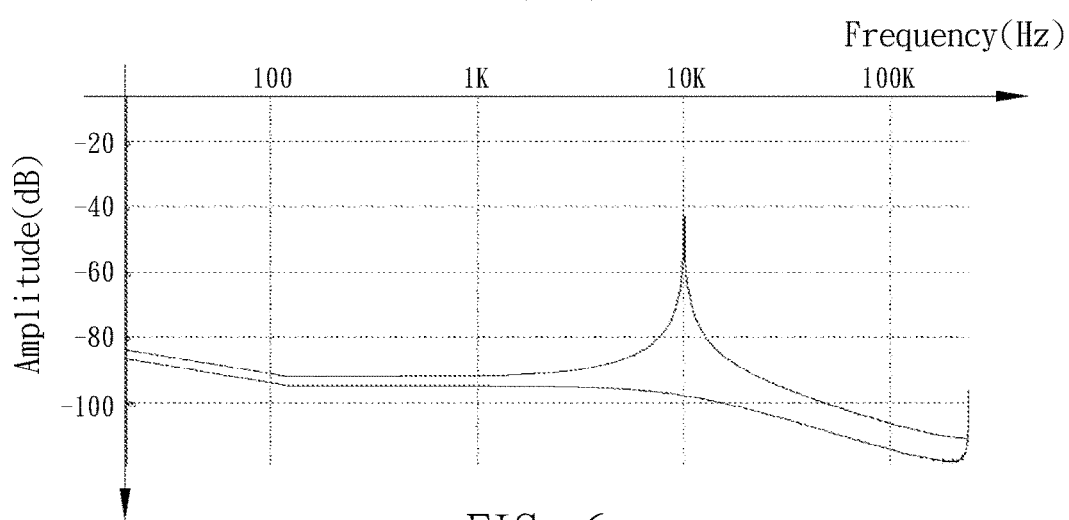
FIG. 6 illustrates schematic diagrams of comparing the self-capacitive touch sensing signals filtered by the simple one-stage low-pass filter in the invention and the prior art respectively.
Figure 7:
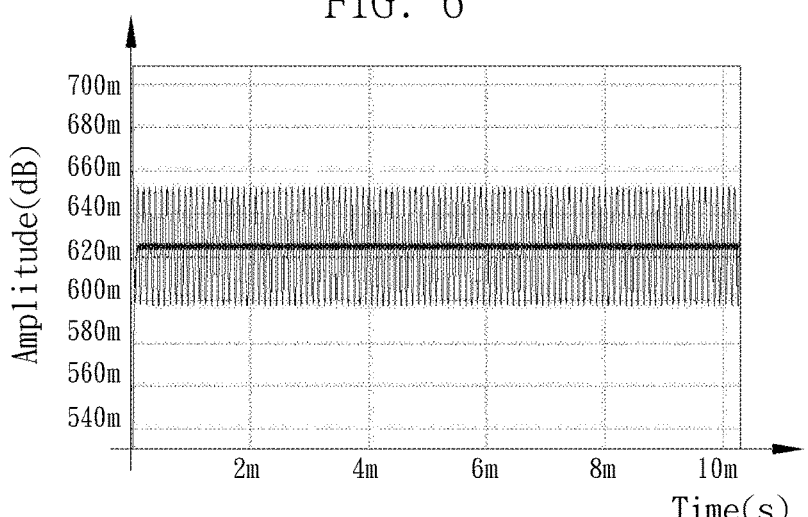
FIG. 7 illustrates schematic diagrams of comparing the performance difference between the self-capacitive touch sensing signals with time in the invention and the prior art respectively.

Then, please also refer to FIG. 6 and FIG. 7. FIG. 6 illustrates schematic diagrams of comparing the self-capacitive touch sensing signals filtered by the simple one-stage low-pass filter in the invention and the prior art respectively. FIG. 7 illustrates schematic diagrams of comparing the performance difference between the self-capacitive touch sensing signals with time in the invention and the prior art respectively.

Obviously, the noise part of the self-capacitive touch sensing signal at low-frequency region cannot be filtered in the prior art; on the contrary, the noise part of the self-capacitive touch sensing signal in the invention is moved to high-frequency region and can be effectively filtered to achieve the noise suppressing effect. It should be noticed that the band of the noise moved to high-frequency region is (signal reversing frequency+noise frequency/signal reversing frequency−noise frequency). The invention moves the noise part of the self-capacitive touch sensing signal from the low-frequency region to the high-frequency region and then uses the low-pass filter to filter out the noise part at the high-frequency region; therefore, the noise removing performance of the invention will be much better than that of the prior art.

In addition, although only two-stage voltage levels (e.g., the first external charging voltage (V1) and the second external charging voltage (−V1)) are switched in the above-mentioned embodiments, in fact, multiple-stage voltage levels (e.g., three-stage voltage levels or more) can be also used based on practical needs without any limitations.

Another embodiment of the invention is a noise suppressing method applied to a self-capacitive touch panel. In this embodiment, the noise suppressing method is used to suppress an external environmental noise when the self-capacitive touch panel senses a capacitance changing signal generated by touch.

Figure 8:
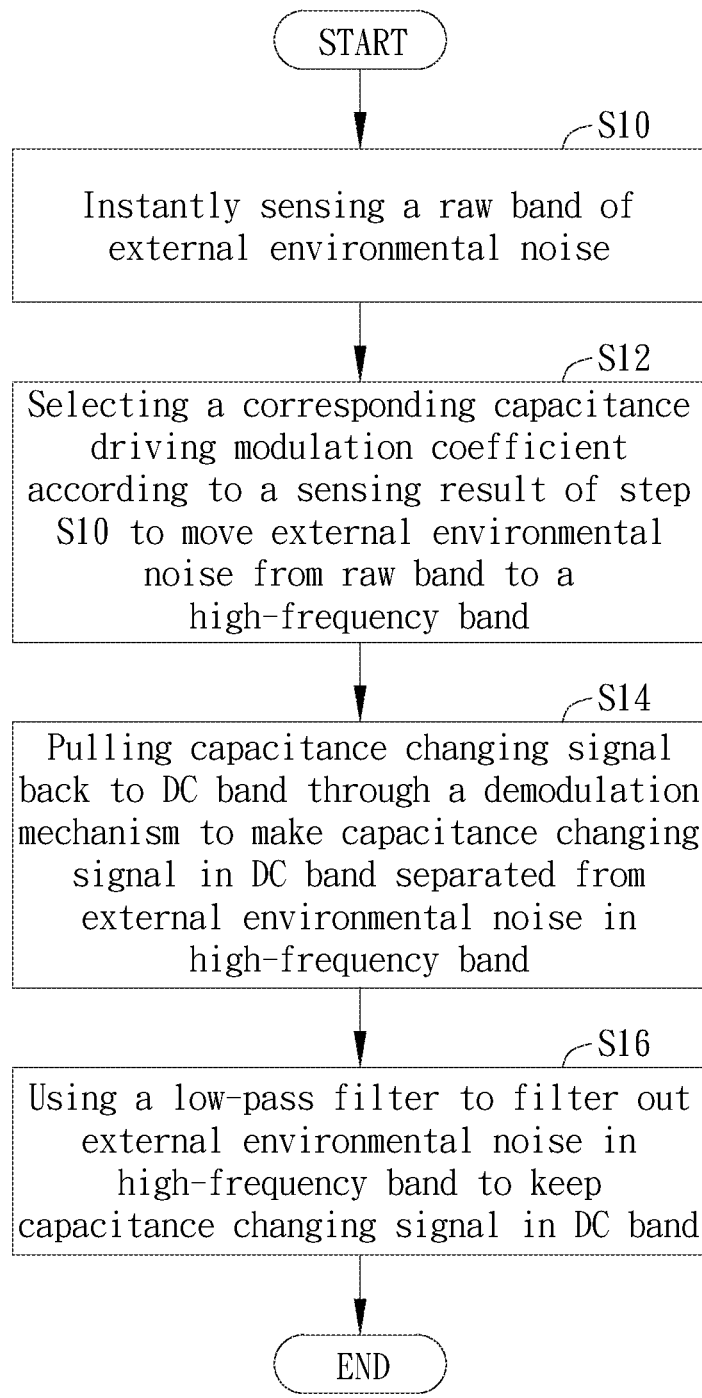
FIG. 8 illustrates a flowchart of the noise suppressing method in another preferred embodiment of the invention.

Please refer to FIG. 8. FIG. 8 illustrates a flowchart of the noise suppressing method in this embodiment. As shown in FIG. 8, the noise suppressing method includes the following steps of:

Step S10: instantly sensing a raw band of the external environmental noise, wherein the raw band is near a direct current (DC) band of the capacitance changing signal;

Step S12: selecting a corresponding capacitance driving modulation coefficient according to a sensing result of Step S10 to move the external environmental noise from the raw band to a high-frequency band, wherein a frequency of the high-frequency band is higher than that of the raw band and the DC band;

Step S14: pulling the capacitance changing signal back to the DC band through a demodulation mechanism to make the capacitance changing signal in the DC band separated from the external environmental noise in the high-frequency band; and Step S16: using a low-pass filter to filter out the external environmental noise in the high-frequency band to keep the capacitance changing signal in the DC band.

In practical applications, the noise suppressing method can also switch a first external charging voltage or a second external charging voltage to charge a capacitor according to a specific order, wherein the first external charging voltage is higher than the second external charging voltage, but not limited to this.

When the first external charging voltage charges the capacitor, a first charge amount stored in the capacitor is a product of a capacitance of the capacitor and the first external charging voltage; when the second external charging voltage charges the capacitor, a second charge amount stored in the capacitor is a product of the capacitance of the capacitor and the second external charging voltage.

Compared to the prior art, the invention provides a self-capacitive touch sensing circuit and a noise suppressing method applied to a self-capacitive touch panel to move a self-capacitive sensing signal to a band having less environmental noise through a driving way of instantly adjusting modulation coefficient and then modulate the self-capacitive sensing signal to the DC band and use a simple one-stage low-frequency filter to filter the self-capacitive sensing signal, so that the signal-to-noise ratio of the self-capacitive sensing signal can be effectively increased. The self-capacitive touch sensing circuit and the noise suppressing method of the invention have the following advantages:

(1) Suitable for high noise capacitance sensing environment;
(2) Effectively reducing capacitance driving time;
(3) Effectively reducing entire power consumption for capacitance driving;
(4) Achieving better touch sensing effect.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A self-capacitive touch sensing circuit, applied to a self-capacitive touch panel, for sensing a capacitance variation of a capacitor when the self-capacitive touch panel is touched and suppressing an external environmental noise, the self-capacitive touch sensing circuit comprising:

an operational amplifier having a first input terminal, a second input terminal and an output terminal, wherein the first input terminal is coupled to the capacitor and the second input terminal is coupled to ground, and the output terminal outputs an output voltage;

an internal capacitor coupled between the output terminal and the first input terminal of the operational amplifier;

a first switch having a terminal coupled to a first external charging voltage and another terminal coupled between the capacitor and the first input terminal;

a second switch having a terminal coupled to a second external charging voltage and another terminal coupled between the capacitor and the first input terminal;

an analog-to-digital converter coupled to the output terminal of the operational amplifier;

a digital signal processor coupled to the analog-to-digital converter;

a first polarity unit, coupled between the output terminal of the operational amplifier and the analog-to-digital converter, for receiving the output voltage having analog form from the output terminal of the operational amplifier and then outputting the output voltage to the analog-to-digital converter by maintaining a polarity of the output voltage; and a second polarity unit, coupled between the output terminal of the operational amplifier and the analog-to-digital converter, for receiving the output voltage having analog form from the output terminal of the operational amplifier and then outputting the output voltage to the analog-to-digital converter by reversing the polarity of the output voltage;

wherein the first external charging voltage is higher than the second external charging voltage; the first switch and the second switch are switched according to a specific order, so that the first external charging voltage or the second external charging voltage charges the capacitor.

2. The self-capacitive touch sensing circuit of claim 1, wherein the another terminal of the first switch and the another terminal of the second switch are both coupled to a node between the capacitor and the first input terminal.

3. The self-capacitive touch sensing circuit of claim 2, further comprising:

a third switch coupled between the node and the first input terminal.

4. The self-capacitive touch sensing circuit of claim 3, wherein under an odd-numbered phase, the first switch is conducted but the second switch and the third switch are not conducted, then the first external charging voltage charges the capacitor, and a first charge amount stored in the capacitor is a product of a capacitance of the capacitor and the first external charging voltage.

5. The self-capacitive touch sensing circuit of claim 4, wherein under an even-numbered phase, the third switch is conducted but the first switch and the second switch are not conducted, then the output voltage is a quotient of the first charge amount divided by a capacitance of the internal capacitor.

6. The self-capacitive touch sensing circuit of claim 5, wherein when the capacitor is touched, a product of a first output voltage variation of the output voltage and the internal capacitor is equal to a product of the first external charging voltage and the capacitance variation when the capacitor is touched.

7. The self-capacitive touch sensing circuit of claim 3, wherein under an odd-numbered phase, the second switch is conducted but the first switch and the third switch are not conducted, then the second external charging voltage charges the capacitor, and a second charge amount stored in the capacitor is a product of a capacitance of the capacitor and the second external charging voltage.

8. The self-capacitive touch sensing circuit of claim 7, wherein under an even-numbered phase, the third switch is conducted but the first switch and the second switch are not conducted, then the output voltage is a quotient of the second charge amount divided by a capacitance of the internal capacitor.

9. The self-capacitive touch sensing circuit of claim 8, wherein when the capacitor is touched, a product of a second output voltage variation of the output voltage and the internal capacitor is equal to a product of the second external charging voltage and the capacitance variation when the capacitor is touched.

10. A self-capacitive touch sensing circuit, applied to a self-capacitive touch panel, for sensing a capacitance variation of a capacitor when the self-capacitive touch panel is touched and suppressing an external environmental noise, the self-capacitive touch sensing circuit comprising:
    an operational amplifier having a first input terminal, a second input terminal and an output terminal, wherein the first input terminal is coupled to the capacitor and the second input terminal is coupled to ground, and the output terminal outputs an output voltage;
    an internal capacitor coupled between the output terminal and the first input terminal of the operational amplifier;
    a first switch having a terminal coupled to a first external charging voltage and another terminal coupled between the capacitor and the first input terminal;
    a second switch having a terminal coupled to a second external charging voltage and another terminal coupled between the capacitor and the first input terminal;
    an analog-to-digital converter coupled to the output terminal of the operational amplifier;
    a digital signal processor coupled to the analog-to-digital converter;
    a first polarity unit, coupled to the digital signal processor, for receiving the output voltage having digital form converted from analog form by the analog-to-digital converter and processed by the digital signal processor and then maintaining a polarity of the output voltage; and
    a second polarity unit, coupled between the analog-to-digital converter and the digital signal processor, coupled to the digital signal processor, for receiving the output voltage having digital form converted from analog form by the analog-to-digital converter and processed by the digital signal processor and then reversing the polarity of the output voltage.

11. The self-capacitive touch sensing circuit of claim 10, further comprising:
    another digital signal processor, coupled to the first polarity unit and the second polarity unit respectively, for receiving the output voltage maintaining polarity from the first polarity unit and receiving the output voltage reversing polarity from the second polarity unit respectively.

12. A self-capacitive touch sensing circuit, applied to a self-capacitive touch panel, for sensing a capacitance variation of a capacitor when the self-capacitive touch panel is touched and suppressing an external environmental noise, the self-capacitive touch sensing circuit comprising:
    an operational amplifier having a first input terminal, a second input terminal and an output terminal, wherein the first input terminal is coupled to the capacitor and the second input terminal is coupled to ground, and the output terminal outputs an output voltage;
    an internal capacitor coupled between the output terminal and the first input terminal of the operational amplifier;
    a first switch having a terminal coupled to a first external charging voltage and another terminal coupled between the capacitor and the first input terminal;
    a second switch having a terminal coupled to a second external charging voltage and another terminal coupled between the capacitor and the first input terminal;
    an analog-to-digital converter coupled to the output terminal of the operational amplifier;
    a digital signal processor coupled to the analog-to-digital converter;
    a first polarity unit, coupled between the analog-to-digital converter and the digital signal processor, for receiving the output voltage having digital form converted from analog form by the analog-to-digital converter and then outputting the output voltage to the digital signal processor by maintaining a polarity of the output voltage; and
    a second polarity unit, coupled between the analog-to-digital converter and the digital signal processor, for receiving the output voltage having digital form converted from analog form by the analog-to-digital converter and then outputting the output voltage to the digital signal processor by reversing the polarity of the output voltage.

* * * * *